United States Patent
Zhang et al.

(10) Patent No.: US 7,254,435 B2
(45) Date of Patent: Aug. 7, 2007

(54) METHOD AND MAGNETIC RESONANCE APPARATUS FOR CALIBRATING COIL SENSITIVITIES

(75) Inventors: Qiang Zhang, Chicago, IL (US);
Jiamin Wang, Shenzhen (CN);
Orlando Simonetti, Chicago, IL (US);
Gerhard Laub, Chicago, IL (US);
Berthold Kiefer, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 878 days.

(21) Appl. No.: 10/355,737

(22) Filed: Jan. 31, 2003

(65) Prior Publication Data

US 2004/0152969 A1 Aug. 5, 2004

(51) Int. Cl.
*A61B 5/055* (2006.01)
(52) U.S. Cl. .................. 600/410; 600/422; 324/309
(58) Field of Classification Search ............... 600/410, 600/422; 324/307, 309, 318, 322
See application file for complete search history.

(56) References Cited

U.S. PATENT DOCUMENTS 6,289,232 B1 * 9/2001 Jakob et al. ............... 600/410

OTHER PUBLICATIONS

"AUTO-SMASH: A Self-Calibrating Technique for SMASH Imaging," Jakob et al., Magnetic Resonance Materials In Physics, Biology and Medicine, vol. 7 (1998) pp. 42-54.
"VD-AUTO-SMASH Imaging," Heidemann et al., Magnetic Resonance in Medicine, vol. 45 (2001), pp. 1066-1074.
"Cardiac Real-Time Imaging Using SENSE," Weiger et al., Magnetic Resonance in Medicine, vol. 42 (2001), pp. 177-184.
"SENSE: Sensitivity Encoding for Fast MRI," Pruessmann et al., Magnetic Resonance in Medicine, vol. 42, (1999) pp. 952-962.

* cited by examiner

*Primary Examiner*—Ruth S. Smith
(74) *Attorney, Agent, or Firm*—Schiff Hardin LLP

(57) ABSTRACT

In a method and magnetic resonance imaging apparatus wherein magnetic resonance signals are simultaneously received from an examination subject by multiple reception coils, a single, uninterrupted pulse sequence is executed which includes reference scans of the subject with a first sequence kernel that is optimized for coil sensitivity calibration, immediately followed by a series of accelerated image scans with a second sequence kernel, different from the first sequence kernel, that is optimized for imaging. Coil sensitivity maps for the respective coils are calculated from the data acquired in the reference scans, and an image of the subject is reconstructed by operating on the image data with a parallel reconstruction algorithm employing the calculated coil sensitivity maps.

15 Claims, 4 Drawing Sheets

METHOD AND MAGNETIC RESONANCE APPARATUS FOR CALIBRATING COIL SENSITIVITIES

BACKGROUND OF THE INVENTION

1. Field of the Invention

The present invention is directed to a method and magnetic resonance MR apparatus of the type employing multiple coils for obtaining magnetic resonance signals, and in particular to a method and apparatus for calibrating the sensitivities of those coils.

2. Description of the Prior Art

Magnetic resonance signals are received with multiple coils in a magnetic resonance imaging apparatus in many types of magnetic resonance imaging sequences. These types of sequences are generally referred to as partially parallel acquisition (PPA) techniques, and include the known SMASH and SENSE sequences, as well as others. Details that are common to most PPA techniques are described in co-pending application Ser. No. 10/117,396, filed Apr. 5, 2002 ("Magnetic Resonance Imaging Method and Apparatus Employing Partially Parallel Acquisition," Griswold), now U.S. Pat. No. 6,841,998, the teachings of which are incorporated herein by reference. In sequences employing PPA, an accelerated imaging acquisition is possible because magnetic resonance signals are being simultaneously received by multiple reception antennas (reception coils). The received signals are processed in parallel, however, it is important to have knowledge of the coil sensitivity of each reception coil in the processing of the received signals. Processing errors would occur if the signals were processed based on the assumption that all of the coil sensitivities are identical.

Currently, two methods are known for calibrating the coil sensitivities for this purpose.

In a first of these known methods, reference scans are performed in a separate measurement before the accelerated image acquisition. As schematically indicated in FIG. 1A herein, the reference scan can be a 2D reference scan conducted with the same slice orientation and position as each slice for which an image is to be obtained in the accelerated imaging. As shown in FIG. 1A, if images of two slices (Slice 1 and Slice 2) are to be obtained, a reference scan in this version is conducted preceding each accelerated imaging signal acquisition.

Alternatively, the reference scan can be a volume reference scan (3D reference) as indicated in FIG. 1B, and therefore a single volume reference scan can precede the respective accelerated imaging signal acquisitions for multiple slices.

A disadvantage associated with this method (both versions) is that the separation of the reference scan and the imaging scan in different signal acquisition measurements may cause coil sensitivity misalignment between the two types of scans, and thus artifacts may arise in the reconstructed images. Moreover, in real time magnetic resonance scans, the slice orientation and position may be adjusted interactively, and therefore it is not convenient, and may not be possible, to undertake a separate reference scan each time the slice is redefined. Data sharing between the reference scan or scans, and the imaging scans, introduces additional engineering workloads.

The second of the aforementioned known methods for calibrating coil sensitivities was developed to address these problems.

The second of these known methods for calibrating coil sensitivities is referred to as self-calibration. An example of this technique is AUTO-SMASH, as described in "V-D-AUTO-SMASH Imaging" Heidemann et al., Magnetic Resonance In Medicine, Vol. 45 (2001), pages 1066-1074 and "AUTO-SMASH: A Self-Calibrating Technique for SMASH Imaging," Jakob et al., Magnetic Resonance Materials in Physics, Biology and Medicine, Vol. 7 (1988), pgs 42-54. Self-calibration is schematically indicated in FIG. 2 herein. In an accelerated imaging scan, a small number of additional k-space centerlines are acquired, and these lines can be used as reference scans for coil sensitivity calibration as well for imaging scans, to improve the signal-to-noise ratio. The reference scans and the accelerated imaging scans now share the same slice definition. The coil sensitivity information also is updated in each measurement to avoid the aforementioned coil sensitivity, misalignment problem. Nevertheless, there are several problems associated with self-calibration. First, the acquisition of additional k-space centerlines represents a substantial obstacle to improving data acquisition efficiently. Second, reference scans are limited by the imaging parameters that are defined for the accelerated imaging scans, such as field of view (FOV), bandwidth, etc. Third, the number of reference scans is limited so as to avoid any significant reduction in the actual acceleration factor due to the reference lines. Lastly, both the reference scans and the imaging scans must be conducted using the same type of magnetic resonance pulse sequence. This may compromise the coil sensitivity calibration, as shown in FIG. 3 herein.

FIG. 3 is a comparison between the coil sensitivity calibration using three types of sequences, namely spin-echo, FLASH, and TrueFISP. A total of 128 phase-encoding lines were measured for reference scans. A 100 Hz frequency offset was introduced to simulate the possible magnetic field inhomogeneity in the region of a human heart. The sensitivity of one coil element calculated using data from the spin echo sequence is employed as the "ideal" standard. The difference between the FLASH and spin echo sequence is shown as curve A. Curve B shows the difference between the TrueFISP and spin echo sequence. Clearly there is a much larger deviation in coil sensitivity calibrated by the TrueFISP sequence, which is more sensitive to the off-resonance effects than the FLASH sequence

SUMMARY OF THE INVENTION

It is an object of the present invention to provide a method and apparatus for calculating coil sensitivities for use in magnetic resonance imaging, particularly magnetic resonance imaging with partially parallel acquisition, wherein the aforementioned problems associated with known methods are alleviated.

This object is achieved in accordance with the principles of the present invention in a magnetic resonance imaging method and a magnetic resonance apparatus operated in accordance with the method, wherein, in a single, continuous sequence, a set of reference scans is acquired using a sequence kernel (sequence type) which is optimized for coil sensitivity calibration, and measurement data for an accelerated image scan are acquired using a different sequence kernel that is optimized for imaging. The accelerated image scan data do not include the additional reference lines as are present in conventional techniques. A coil sensitivity map is then calculated for each coil from the data obtained in the reference scans. A parallel reconstruction algorithm is then employed, using the calculated coil sensitivity maps, to reconstruct an image of a subject from the data obtained in the accelerated image scans.

By using a continuous sequence which is composed of two sequence kernels, the different sequence kernels can be respectively optimized for coil sensitivity calibration and for image acquisition independently of each other so that limitations imposed by the settings for the imaging scans do not affect the reference scans, and vice versa. For example, the reference scans can employ a FLASH kernel, which is less sensitive to off-resonance effects, has a large FOV, a small flip angle, a FatSat pulse, etc. The image acquisition sequence can employ a TrueFISP kernel, which has a smaller FOV, a high flip angle for better signal-to-noise ratio, etc.

Moreover, the first kernel employed for the coil sensitivity calibration does not have to produce the same contrast as the second kernel used for image acquisition, thereby allowing the calibration scans (reference scans) to be conducted in a very short time hence the ability to use a FLASH kernel with a small flip angle. Because these lines can be acquired rapidly, more reference lines can be obtained to achieve higher resolution and a larger FOV coverage.

Additionally, moving the reference scans out of the accelerated imaging scans improves the temporal resolution in the imaging scans. Simultaneously, the coil sensitivity calibration can be improved by increasing the number of reference scans without affecting the temporal resolution. A single measurement employing two kernels in succession allows both kernels to share the same slice orientation and position information, which is important in interactive, real-time applications.

Additionally, the inventive method and apparatus minimize the time delay between the coil sensitivity calibration and the image acquisition, and thus the possibility for coil sensitivity misalignment is minimized.

The inventive method and apparatus are specially suited for cardiac dynamic studies using a steady-state sequence, by taking advantage of the conventional "dummy" heartbeat for a steady state preparation, and thus no additional data acquisition time is required. Moreover, the image reconstruction can be initiated immediately after all of the calibration scans have been completed, and therefore the image reconstruction time can be reduced compared to the aforementioned self-calibration method.

DESCRIPTION OF THE PREFERRED EMBODIMENTS

Figure 1A:
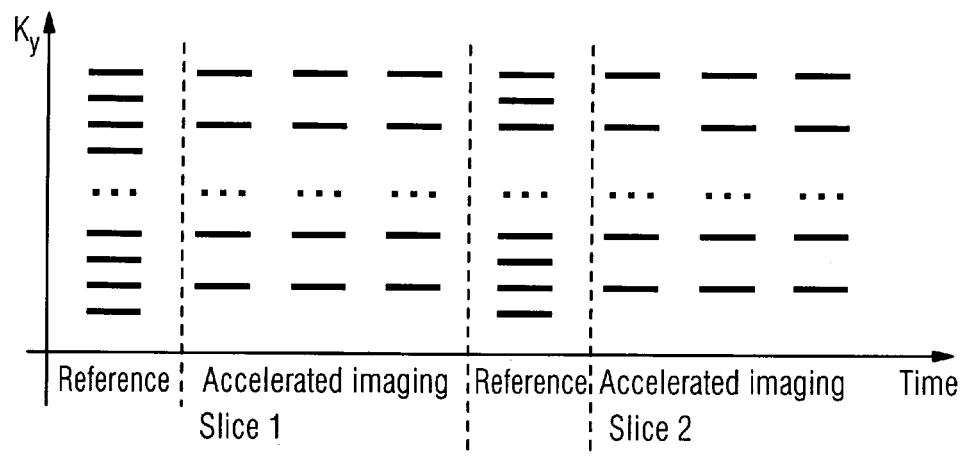
FIGS. 1A and 1B as discussed above, illustrate two versions of a first known method for coil sensitivity calibration.
Figure 1B:
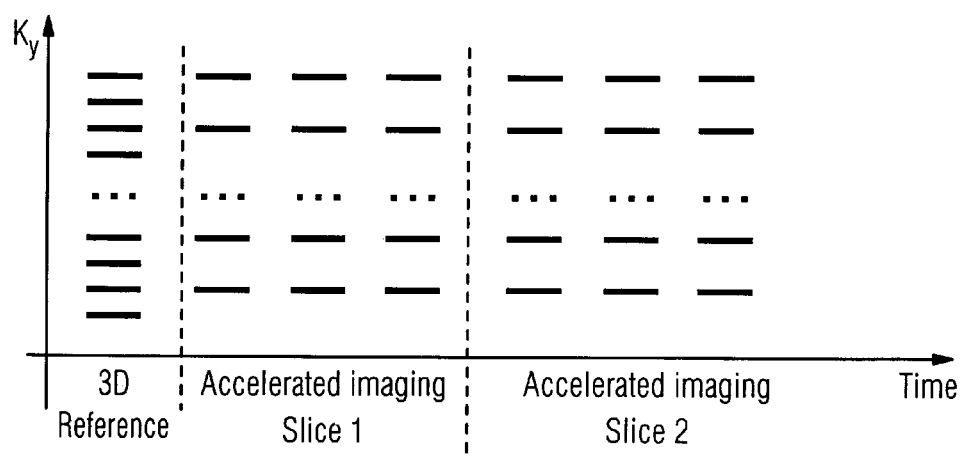
Figure 2:
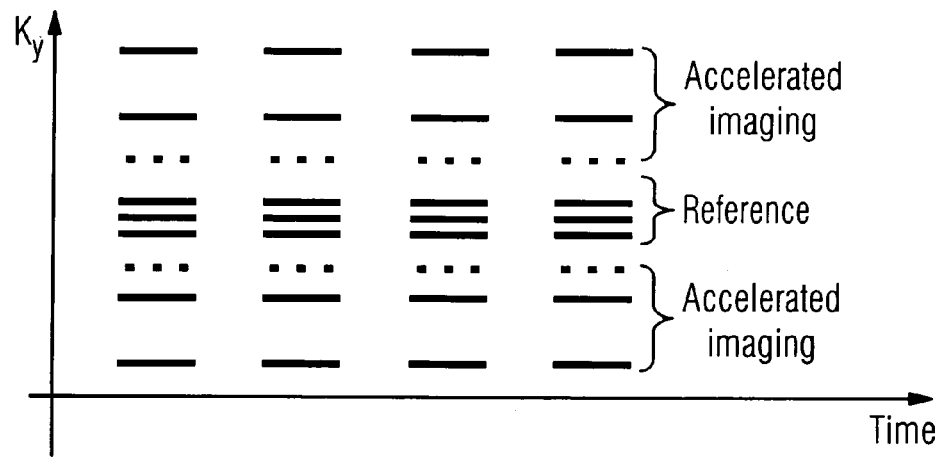
FIG. 2, as discussed above, illustrates a second known method for coil sensitivity calibration.
Figure 3:
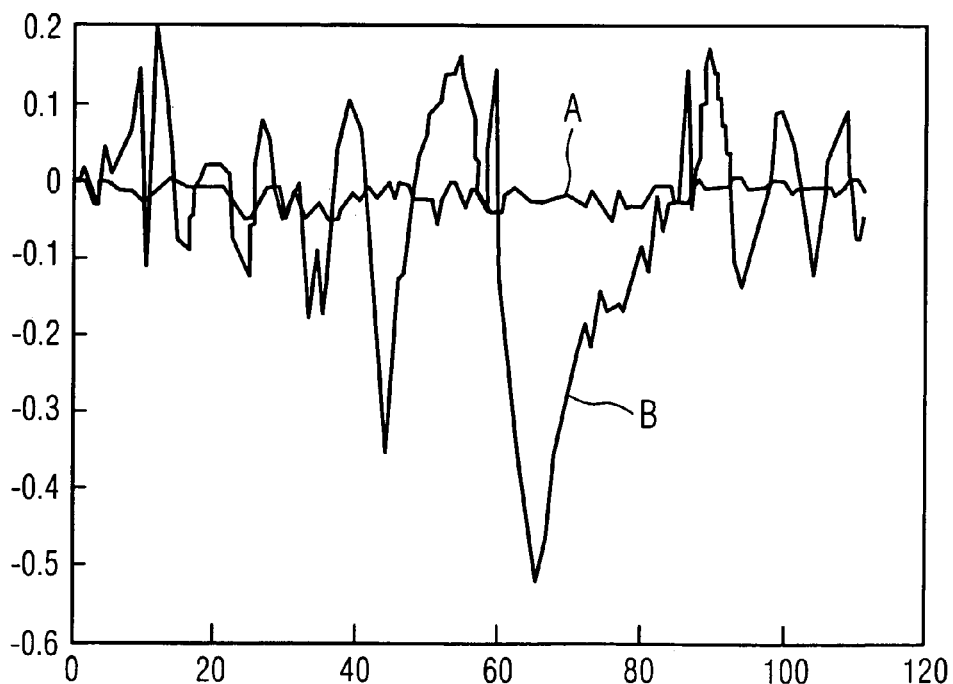
FIG. 3, as discussed above, is a comparison between coil sensitivity calibration using different types of sequences, namely spin echo, FLASH and TrueFISP.
Figure 4:
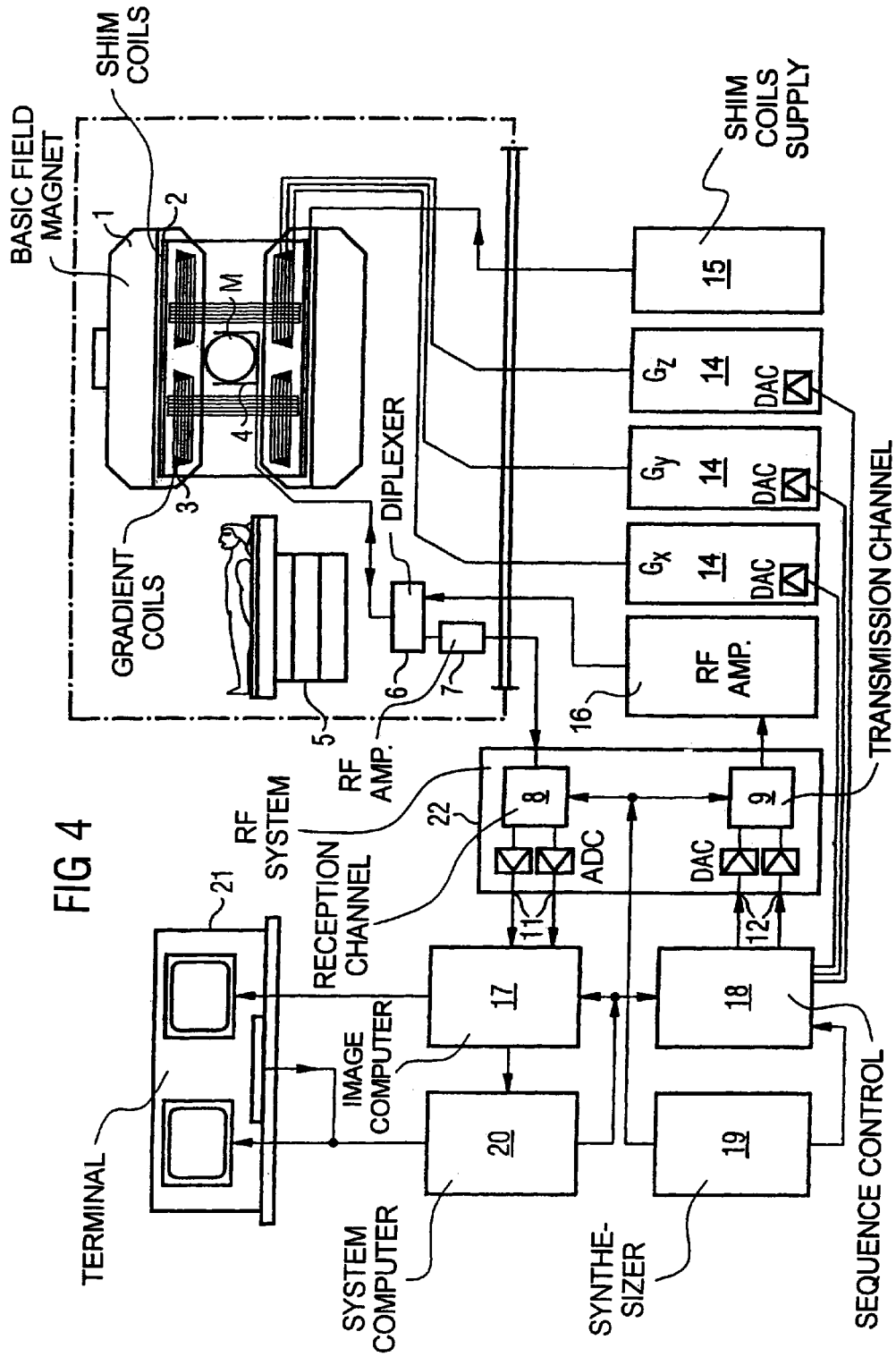
FIG. 4 is a schematic block diagram of a magnetic resonance imaging apparatus constructed and operating in accordance with the principles of the present invention.

FIG. 4 schematically illustrates a magnetic resonance imaging (tomography) apparatus for generating a nuclear magnetic image of a subject according to the present invention. The components of the nuclear magnetic resonance tomography apparatus correspond to those of a conventional tomography apparatus, but it is controlled according to the invention. A basic field magnet 1 generates a time-constant, intense magnetic field for polarization (alignment) of the nuclear spins in the examination region of a subject such as, for example, a part of a human body to be examined. The high homogeneity of the basic magnetic field required for the nuclear magnetic resonance measurement is defined in a spherical measurement volume M in which the part of the human body to be examined is introduced. For supporting the homogeneity demands and, in particular, for eliminating time-invariable influences, shim plates of ferromagnetic material are attached at suitable locations. Time-variable influences are eliminated by shim coils 2 that are driven by a shim power supply 15.

A cylindrical gradient coil system 3 is built into the basic field magnet 1, the system 3 being composed of three sub-windings. Each sub-winding is supplied with current by an amplifier 14 for generating a linear gradient field in the respective directions of a Cartesian coordinate system. The first sub-winding of the gradient field system 3 generates a gradient Gx in the x-direction, the second sub-winding generates a gradient Gy in the y-direction, and the third sub-winding generates a gradient Gz in the z-direction. Each amplifier 14 has a digital-to-analog converter DAC that is driven by a sequence control 18 for the time-controlled generation of gradient pulses.

A radio-frequency antenna 4 is situated within the gradient field system 3. The antenna 4 converts the radio-frequency pulses emitted by a radio-frequency power amplifier into an alternating magnetic field for exciting the nuclei and aligning the nuclear spins of the subject under examination, or of a region of the subject under examination. The radio-frequency antenna 4 is composed of one or more RF transmission coils and a number of RF reception coils in the form of an arrangement (preferably linear) of component coils. The alternating field proceeding from the precessing nuclear spins, i.e. the nuclear spin echo signals produced as a rule by a pulse sequence composed of one or more radio-frequency pulses and one or more gradient pulses, is also converted into a voltage by the RF reception coils of the radio-frequency antenna 4, this voltage being supplied via an amplifier 7 to a radio-frequency reception channel 8 of a radio-frequency system 22. The radio-frequency system 22 also has a transmission channel 9 wherein the radio-frequency pulses are generated for exciting magnetic nuclear resonance. The respective radio-frequency pulses are digitally presented as a sequence of complex numbers on the basis of a pulse sequence in the sequence control 18 prescribed by the system computer 20. This number sequence—as a real part and an imaginary part—is supplied via respective inputs 12 to a digital-to-analog converter DAC in the radio-frequency system 22 and is supplied from there to a transmission channel 9. In the transmission channel 9, the pulse sequences are modulated onto a radio-frequency carrier signal having a basic frequency corresponding to the resonant frequency of the nuclear spins in the measurement volume.

The switching from transmission mode to reception mode ensues via a transmission/reception diplexer 6. The RF transmission coil of the radio-frequency antenna 4 radiates the radio-frequency pulses, based on signals from a radio-frequency amplifier 16, for excitation of the nuclear spins into the measurement volume M and samples the resulting echo signals via the RF reception coils. The acquired nuclear magnetic resonance signals are phase-sensitively demodulated in the reception channel 8 of the radio-frequency system 22 and are converted via respective analog-to-digital converters ADC into the real part and the imaginary part of the measured signal, which are respectively supplied to outputs 11. An image computer 17 reconstructs an image from the measured data acquired in this way. Administration of the measured data, the image data and the control programs ensues via the system computer 20. On the basis of control programs, the sequence control 18 monitors the generation of the respectively desired pulse sequences and the corresponding sampling of k-space. In particular, the sequence control 18 controls the timed switching of the gradients, the emission of the radio-frequency pulses with defined phase and amplitude, as well as the reception of the nuclear magnetic resonance signals. The timing signals for the radio-frequency system 22 and the sequence control 18 is made available by a synthesizer 19. The selection of corresponding control programs for generating a nuclear magnetic resonance image as well as the presentation of the generated nuclear magnetic resonance image ensues via a terminal 21 that has a keyboard as well as one or more picture screens.

Figure 5:
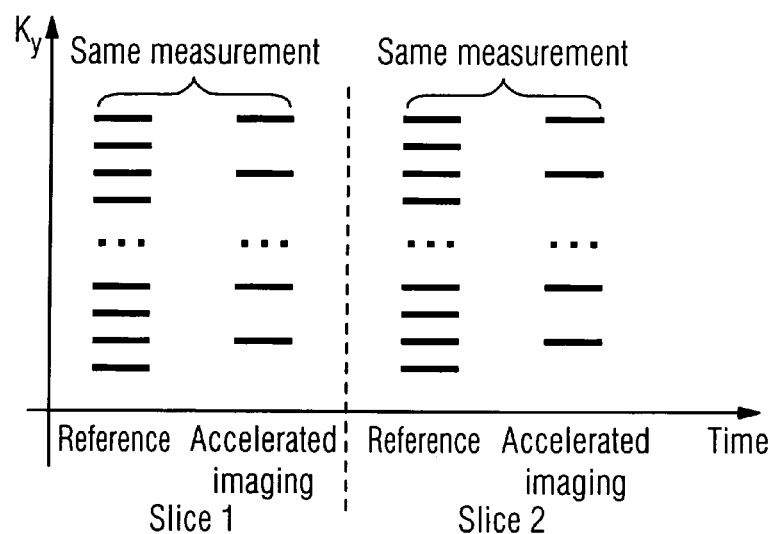
FIG. 5 schematically illustrates how reference scans and accelerated imaging scans are conducted for different slices in accordance with the inventive method.

The system computer 20 and the sequence control 18 are programmed in accordance with the present invention to conduct a continuous sequence, embodying reference scans and image acquisition scans, wherein the reference scans are executed using a first sequence kernel, optimized for coil sensitivity calibration, and wherein the image acquisition scans are based on a second sequence kernel, different from the first kernel, optimized for imaging. The inventive method which is executed by the apparatus shown in FIG. 4 is schematically illustrated in FIG. 5 for two slices, Slice 1 and Slice 2. Time is indicated on the horizontal axis and the y-direction ($K_y$) of k-space is indicated on the vertical axis. As stated above, each complete measurement sequence executes a combination of two pulse sequence kernels. The first kernel acquires data for coil sensitivity calibration and the second kernel executes an accelerated image acquisition sequence, which can be used for reconstructing a single image of an examination subject, or reconstructing a series of images in a dynamic study, such as cardiac cine imaging.

Figure 6:
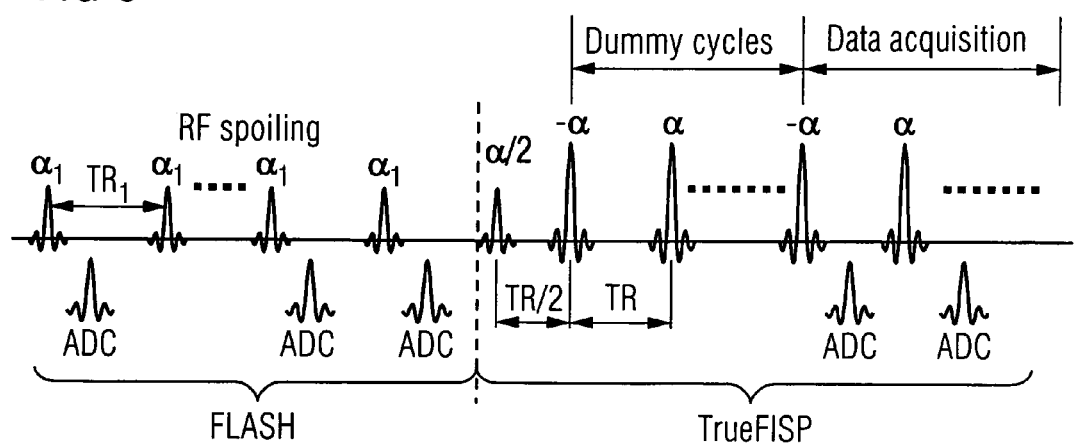
FIG. 6 is an exemplary embodiment of a pulse sequence for the inventive method, employing a FLASH kernel for the reference scans and TrueFISP kernel for the accelerated imaging scans.

An exemplary embodiment of a complete sequence in accordance with the invention is a shown in FIG. 6, wherein a FLASH sequence is used as the first kernel and TrueFISP sequence is used as the second kernel. Within each kernel, the respective sequence is executed in a conventional manner. Thus the FLASH sequence proceeds with RF spoiling by a series of RF pulses each having a flip angle $\alpha_1$, separated by a repetition time $TR_1$. After each RF pulse combination, an analog-to-digital converted (ADC) signal is obtained, which represents the magnetic resonance data.

As shown in FIG. 6, the FLASH sequence is immediately followed by a TrueFISP sequence which employs a first RF pulse having a flip angle of $\alpha/2$, followed by RF pulses having alternating flip angles $-\alpha$ and $\alpha$. The sequences respectively beginning with RF pulses of alternating flip angles are separated by a repetition time TR, and the first of those RF pulses is preceded by the $\alpha/2$ RF pulse at a time TR/2. In general $TR_1$ will not be equal to TR. Moreover, the phase-encoding step size ($\Delta k_y$) for the FLASH sequence can be different from $\Delta k_y$ for the TrueFISP sequence, in order to allow a smaller FOV in the TrueFISP sequence. As shown in FIG. 6, and as is conventional for a TrueFISP sequence, so-called dummy cycles are initially executed for steady state preparation, followed by a number of cycles wherein data are acquired, as indicated by ADC signals.

As noted above, the two kernels can be executed with the same slice position and orientation information. As schematically indicated in FIG. 6, the second kernel employed for imaging can have a flip angle which is larger than the flip angle in the first kernel (i.e., $\alpha<\alpha_1$) so that a better signal-to-noise ratio can be obtained in the imaging sequence. Moreover, the contrast for the first kernel need not be the same as (as high as) the contrast for the second kernel, so that the calibration scans can be conducted in a shorter time.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for operating a magnetic resonance imaging apparatus having an antenna array comprised of a plurality of reception coils for simultaneously receiving magnetic resonance signals from a subject, each of said coils having a coil sensitivity, comprising the steps of:
   acquiring a plurality of sets of reference data of a subject by executing a series of reference scans with a first sequence kernel optimized for coil sensitivity calibration;
   obtaining a plurality of sets of image data of said subject by executing a series of accelerated image scans with a second sequence kernel, different from said first sequence kernel, optimized for imaging, by obtaining magnetic resonance signals from said subject simultaneously with multiple reception coils in said plurality of reception coils;
   for each coil, calculating a coil sensitivity map from said sets of reference data; and
   reconstructing an image of said subject by operating on said sets of image data with a parallel reconstruction algorithm employing said coil sensitivity maps.

2. A method as claimed in claim 1 comprising employing a FLASH pulse sequence as said first sequence kernel.

3. A method as claimed in claim 1 comprising employing a TrueFISP pulse sequence as said second sequence kernel.

4. A method as claimed in claim 1 comprising employing a FLASH pulse sequence as said first sequence kernel and a TrueFISP pulse sequence as said second sequence kernel.

5. A method as claimed in claim 1 comprising executing said series of reference scans including generating respective RF pulses each having a first flip angle, and executing said series of accelerated image scans including generating respective RF pulses each having a second flip angle with a magnitude of said second flip angle being different from a magnitude of said first flip angle.

6. A method as claimed in claim 1 comprising executing said series of accelerated image scans with a different contrast than said series of reference scans.

7. A method as claimed in claim 1 comprising executing said series of reference scans with a larger field of view than said accelerated image scans.

8. A method as claimed in claim 1 comprising executing said reference scans to obtain said reference data from a slice of said subject and executing said accelerated image scans to obtain said image data from said slice of said subject, and employing identical information designating a position and an orientation of said slice in each of said series of reference scans and said series of accelerated image scans.

9. A magnetic resonance imaging apparatus comprising:

a magnetic resonance scanner having an antenna array including a plurality of reception coils, each of said reception coils having a coil sensitivity;

a sequence controller connected to said magnetic resonance scanner for operating said magnetic resonance scanner to execute a continuous, uninterrupted pulse sequence comprising a plurality of reference scans of said subject with a first sequence kernel optimized for coil sensitivity calibration followed by a series of accelerated image scans of said subject with a second sequence kernel, different from said first sequence kernel optimized for imaging, by simultaneously obtaining magnetic resonance signals from said subject with multiple coils in said plurality of coils, and thereby obtaining a plurality of sets of reference data from said series of reference scans and a plurality of sets of image data from said series of accelerated image scans; and an image computer connected to said magnetic resonance scanner for receiving said sets of reference data and said sets of image data therefrom, said image computer calculating respective coil sensitivity maps from said sets of reference data for said coils, and operating on said sets of image data with a parallel reconstruction algorithm, employing said coil sensitivity maps, to reconstruct an image of said subject.

10. An apparatus as claimed in claim 9 wherein said sequence controller operates said magnetic resonance scanner with a FLASH pulse sequence as said first sequence kernel.

11. An apparatus as claimed in claim 9 wherein said sequence controller operates said magnetic resonance scanner with TrueFISP pulse sequence as said second sequence kernel.

12. An apparatus as claimed in claim 9 wherein said sequence controller operates said magnetic resonance scanner with a FLASH pulse sequence as said first sequence kernel and a TrueFISP pulse sequence as said second sequence kernel.

13. An apparatus as claimed in claim 9 wherein said sequence controller operates said magnetic resonance scanner to execute said series of reference scans including generating respective RF pulses each having a first flip angle, and executing said series of accelerated image scans including generating respective RF pulses each having a second flip angle with a magnitude of said second flip angle being different form a magnitude of said first flip angle.

14. An apparatus as claimed in claim 9 wherein said sequence controller operates said magnetic resonance scanner to execute said series of accelerated image scans with a different contrast than said series of reference scans.

15. An apparatus as claimed in claim 9 wherein said sequence controller operates said magnetic resonance scanner to execute said series of reference scans with a larger field of view than said accelerated image scans.

* * * * *